March 1, 1966 L. V. BABCOCK 3,238,502

NOISE IMMUNITY CIRCUIT

Filed June 28, 1962

Inventor.
Leonard V. Babcock
By Hofgren, Brady, Wegner, Allen & Stellman
Attorneys.

3,238,502
NOISE IMMUNITY CIRCUIT

Leonard V. Babcock, Arlington Heights, Ill., assignor to Warwick Electronics Inc., a corporation of Delaware Filed June 28, 1962, Ser. No. 205,941
4 Claims. (Cl. 340—148)

This invention relates to an ultrasonic receiver and, more specifically, to a noise immunity circuit for providing a time delay action in an ultrasonic receiver to suppress action of the receiver during receipt of noise pulses.

In present day ultrasonic remote control receivers, the problem of noise immunity is always of concern to the design engineer. Many of the noise pulses that trigger the units falsely are high amplitude pulses which are rich in harmonic content. When these impulses impinge on the receiving transducer, they are passed by the normally highly selective receiver circuits in a brute force fashion. In systems where only carrier detection is used to trigger a relay, this means that the detected noise pulse can actuate the relay.

It is, therefore, an objective of this invention to provide an improved ultrasonic remote receiver.

It is a further object of this invention to provide an ultrasonic remote receiver having an improved noise immunity circuit.

It is still a further object of this invention to provide a noise immunity circuit for an ultrasonic receiver wherein time delay is provided for selecting control signals to actuate the receiver from undesired signals.

An additional object of this invention is to provide an inexpensive means for providing noise immunity to ultrasonic remote control receivers.

It is, therefore, a feature of this invention to provide a noise immunity circuit in a remote receiver wherein a pulse is fed back to an earlier stage of the receiver to prevent relay actuation for a predetermined length of time.

It is a further feature of this invention to provide a diode in the biasing circuit of an amplifier stage of a remote control receiver for performing three distinct functions by virtue of its placement in the circuit.

Another feature of the invention is to provide a feedback path which capacitively couples a signal from the detection stage to a diode in the bias path of an amplifier stage of a remote receiver for controlling the bias on that stage.

An additional feature of the invention is to provide in an ultrasonic signal receiver, actuatable by control signals of predetermined frequency and time duration and subject to actuation by noise signals, including an input stage and an output stage for performing a control function, a noise immunity circuit, the circuit comprising a first amplifier circuit, including biasing means, coupled to the input stage; a detector-amplifier circuit coupled to the first amplifier circuit and the output stage; and a time delay circuit including a semi-conductor device coupled to the detector-amplifier circuit and the biasing means for reducing the gain of the first amplifier circuit in response to signals received from said detector-amplifier circuit for a period shorter than the duration of the control signal.

Further objects and advantages will become apparent from the following detailed description taken in connection with the accompanying drawings in which.

Figure 1:
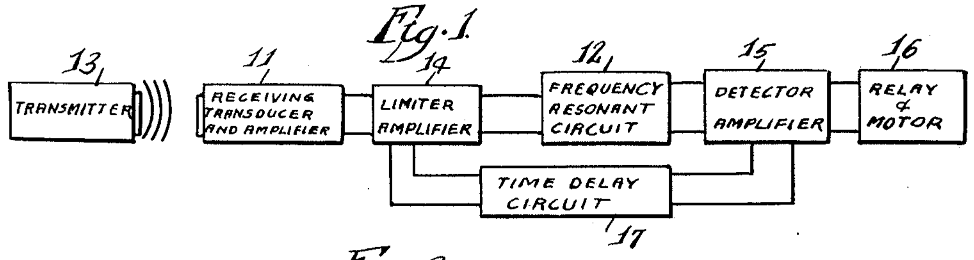
FIGURE 1 is a block diagram of an ultrasonic remote control receiver.

While this invention is susceptible of embodiment in many different forms, there is shown in the drawings, and will herein be described in detail, an embodiment of the invention with the understanding that the present disclosure is to be considered as an exemplification of the principles of the invention and is not intended to limit the invention to the embodiments illustrated. The scope of the invention will be pointed out in the appended claims.

Referring now specifically to FIGURE 1, there is shown a remote control receiver which consists of a receiving transducer and amplifier stage 11 coupled to a limiter-amplifier 14 and adapted to receive ultrasonic signals from a transmitter 13. The output of the limiter-amplifier 14 is fed to a circuit 12, which is resonant to the transmitted frequency, and then to a detection and amplifying circuit 15 which is, in turn, coupled to a relay for actuating a motor to perform a control function of a device that is remotely controlled. A time delay circuit 17 receives a signal from the detection stage 15 and has its output fed to the limiter-amplifier 14.

In operation, the transmitter 13 produces an ultrasonic wave which is received by the receiving transducer and is coupled to the limiter-amplifier 14. Therein the signal is limited as to amplitude, and the highly selective frequency resonant circuit 12 serves to attenuate any signals not in the frequency range of the characteristics of the receiver. The resonant circuit 12 feeds the signal to the detector-amplifier stage 15 wherein it is detected, amplified and used to provide a current path for the relay of stage 16. The time delay circuit 17 receives a pulse from the output of the detector-amplifier 15 and feeds a signal back to the limiter-amplifier stage 14 which reduces the gain of stage 14 for a predetermined length of time. The time delay of circuit 17 is established by the parameters of the circuit so that it is of shorter duration than the duration of the transmitted control signal.

Should a loud noise pulse be generated near the receiving transducer 11 which is rich in harmonics and is of such magnitude that it "brute forces" its way through the transducer and receiver to detector-amplifier stage 15, this would tend to cause actuation of relay 16. However, the time delay circuit which reduces the gain of amplifier stage 14 for a predetermined length of time prevents the noise pulse from actuating the relay unless its duration is equal to or greater than that of the designed control signal.

Figure 2:
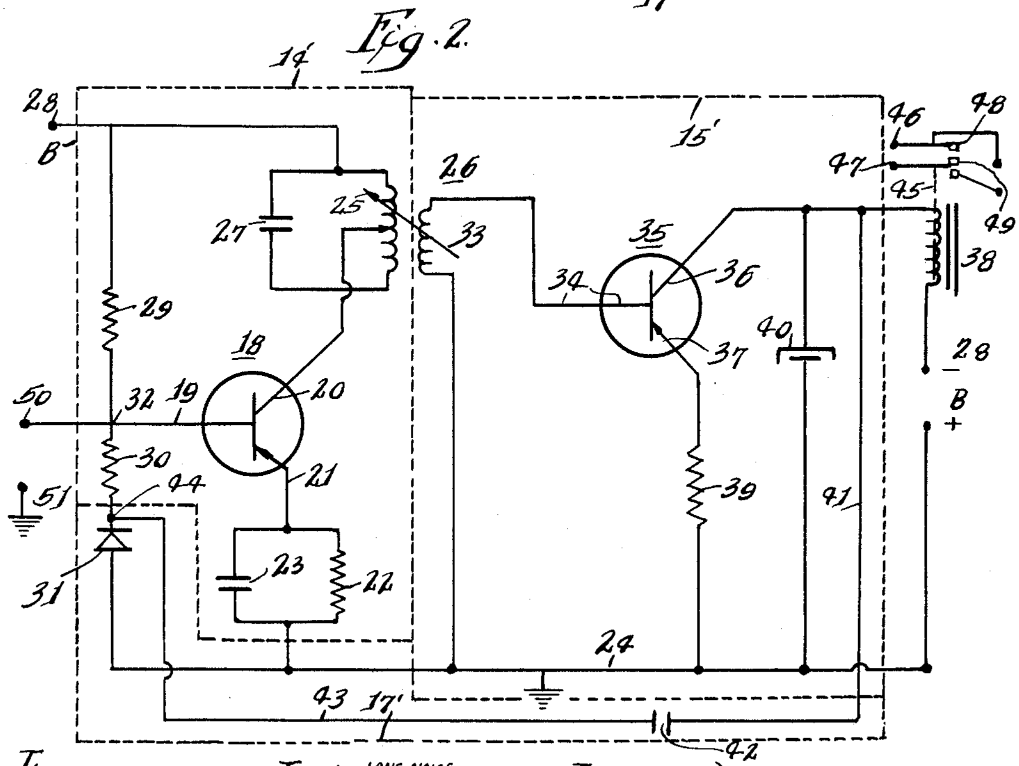
FIGURE 2 is a schematic diagram of a portion of an ultrasonic receiver incorporating the invention.

Referring now specifically to FIGURE 2 wherein one embodiment of the invention is shown, the dashed line 14' encompasses the limiter-amplifier circuit and the frequency resonant circuit, dashed line 15' the detector-amplifying circuit and the dashed line 17' the feedback path for the time delay circuit. The limiter-amplifier stage includes a transistor 18 having base, collector and emitter electrodes 19, 20 and 21. Emitter electrode 21 is coupled through a resistance 22 and a capacitor 23 connected in parallel to a point of ground potential 24. The collector electrode 20 is coupled to a tap of a primary winding 25 of a transformer 26, and a capacitor 27 is coupled in a parallel relationship to winding 25. Capacitor 27 and winding 25 form a tuned resonant circuit, one side of which is coupled to a potential source 28 for supplying the proper operating potentials to the collector and emitter electrodes. In addition, transistor 18 has a series base biasing network including a resistor 29, a resistor 30 and a diode 31 coupled between source 28 and ground potential 24 which has a common point 32 between resistor 29 and 30 joined to base electrode 19.

A secondary winding 33 of transformer 26 is coupled between the point of reference potential 24 and a base electrode 34 of a transistor 35. In addition, transistor 35 has a collector electrode 36 and an emitter electrode 37 coupled to a relay 38 and a resistor 39, respectively, which provide the triggering circuit for a relay 38. A filter capacitor 40 coupled between collector electrode 36 and ground potential 24 is provided for the usual filtering action.

In addition, a feedback path including a wire 41, a capacitor 42, and a wire 43 is provided, coupling the capacitor 42 between collector electrode 36 and a junction point 44 between diode 31 and resistor 30.

Dashed line 45 represents mechanical coupling between relay 38 and switch arms 46 and 47 having contacts 48 and 49 which, when closed, actuate a control device (not shown).

Figure 3:
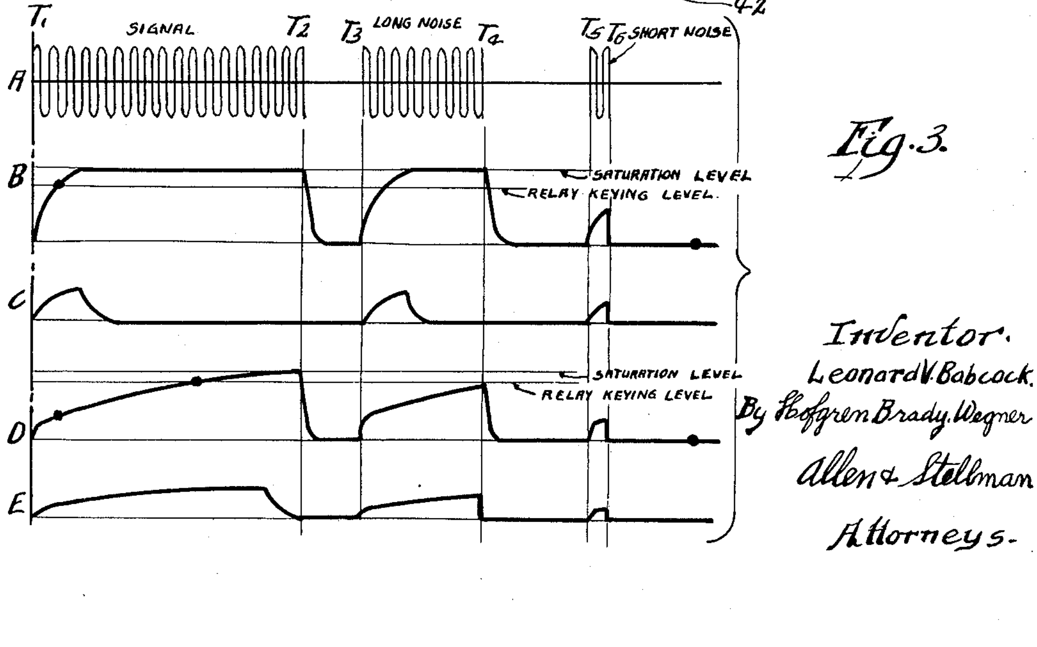
FIGURE 3 represents wave forms at various points of the circuit of FIGURE 2.

In operation, when a control signal is received having a time duration of the time T1–T2 as shown in FIGURE 3, curve (A), the following action takes place in the circuit. The signal is coupled between a pair of terminals 50–51 in FIGURE 2, and the base electrode 19 of transistor 18 receives this signal. It is, in turn, amplified in the transistor and developed across the resonant circuit 25–27 coupled to the collector 20. A bias is developed across resistor 22 in the emitter circuit of transistor 18 and capacitor 23 serves as a by-pass to aid in establishing this bias.

The signal is inductively coupled to secondary 33 of transformer 26 and applied to the base electrode 34 of transistor 35. Since transistor 35 is normally biased in its "off" condition and is shown as a PNP device, negative swings of the signal developed in the winding 33 cause the emitter junction of transistor 35 to be forwardly biased resulting in conduction of current. Positive swings of the signal increase the reverse bias on the base emitter junction, and only the negative pulses are translated by transistor 35. Some degenerative action takes place in resistor 39 in the emitter circuit of transistor 35. The amplified pulses at the collector 36 are filtered by capacitor 40, the collector goes in a more positive direction and a potential appears across relay 38. Current begins to flow in the relay, and when this current reaches a given value, the relay actuates closing contacts 40 and 49.

However, the positive pulse developed at the collector electrode 36 is capacitively coupled through wire 41, capacitor 42 and wire 43 to the junction point 44. The leading edge of the pulse is coupled to diode 31 and back-biases it to its high resistance state, and the base electrode 19 is driven in a positive direction biasing transistor 18 toward cutoff. As transistor 18 gain is reduced, the rise time of the leading edge of the pulse at collector 36 is altered appreciably in the same manner as if the capacitor 40 suddenly increased in value. This altered rate of rise of the leading edge will continue until transistor 35 is saturated. The time involved to reach this point is dependent on the feedback parameters. When collector 36 reaches saturation, the feedback circuit starts to discharge and point 44 returns toward ground. At the end of the signal train, a negative pulse is coupled to diode 31, but this pulse is shorted to ground since it makes the diode cathode negative with respect to anode. Thus, diode 31 serves three distinct purposes.

(1) It provides a low impedance path for biasing the base 19 through resistors 29 and 30 from the power supply 28.

(2) It provides a high impedance point to supply the positive going feedback pulse from capacitor 42 to the base 19.

(3) It provides a low impedance to negative feedback pulses which prevents these negative pulses from reaching base 19 and causing conduction on the trailing edge of noise pulses.

The parameters of the feedback path are selected so that the relay will not actuate for a predetermined length of time. This length of time is such that the relay is actuated during the receipt of the control signal, but is not actuated on shorter noise pulses.

FIGURE 3, curve (A) shows noise signals represented between times T3 and T4, and between T5 and T6 that may also be received. Curve (B) of FIGURE 3 shows the detected output from transistor 35 when no time delay circuit is provided. Curve (C) shows the pulse coupled back to the diode 31 if resistor 30 were disconnected from 44 and returned to ground. Curve (D) shows the detector output when the time delay circuit is used, and curve (E) shows the pulse at diode 31 when connected as shown in FIGURE 2.

Referring to curve (B), relay actuation would occur on both signal and long noise pulse, however, the filtering action provided by capacitor 40 prevents relay actuation by short noise pulses.

Referring to curve (D), it is seen that the rise time has been modified by the feedback pulse so the relay actuates much later in the signal cycle than in curve (B). This delay also prevents the long noise pulse from triggering the relay.

Much the same effect could have been made on the rise time by simply increasing the value of capacitor 40, however, this would also affect the decay time, resulting in the relay remaining actuated far longer than desired in the controlled circuit.

I claim:

1. In an ultrasonic signal receiver actuable by control signals of predetermined frequency and time duration and subject to actuation by noise signals, including an input stage for receiving signals and an output stage for performing a control function, a noise immunity circuit comprising: means, including a first semiconductor device having a first base, emitter and collector electrodes and including a tuned circuit resonant at said predetermined frequency, coupled to said first collector electrode, for amplifying received signals; second means including a second semiconductor device having second emitter, base and collector electrodes and including an inductor inductively coupled to said resonant circuit and connected between said second base and emitter electrodes, for amplifying and detecting said signals; a bias circuit for said first semiconductor device including a first resistor coupled between said first collector and base electrodes and a series circuit including a second resistor and a third semiconductor device coupled between said first base electrode and first emitter electrode; and a capactive feedback circuit coupled between said second collector electrode and the common point between said second resistor and third semiconductor device for reducing the gain of said first semiconductor device in response to received signals for a period short with respect to the duration of said control signals.

2. The noise immunity circuit of claim 1 wherein said capacitor and bias circuit have a time constant shorter than the predetermined time duration of said control signals.

3. In an ultrasonic signal receiver actuable by control signals of predetermined frequency and time duration and subject to actuation by noise signals, including an input stage for receiving signals and an output stage for performing a control function, a noise immunity circuit comprising: means, including a first semiconductor device having first base, emitter and collector electrodes and including a tuned circuit resonant at said predetermined frequency, coupled to said first collector electrode, for amplifying received signals; second means including a second semiconductor device having second emitter, base and collector electrodes and including an inductor inductively coupled to said resonant circuit and connected between said second base and emitter electrodes for amplifying and detecting said signals; a bias circuit coupled to said first emitter, base and collector electrodes; a diode connected between said first base and emitter electrodes, within said bias circuit; and a capactive feedback circuit connected between said second collector electrode and the junction of said first base electrode and said diode.

4. In an ultrasonic signal receiver actuable by control signals of predetermined frequency and time duration and subject to actuation by noise signals, a noise immunity circuit comprising: a first amplifier with an input control element having said signals connected thereto, and having an output; a second amplifier with an input element connected with the output of said first amplifier and having an output; a diode connected with the control element of said first amplifier; bias means connected with said second amplifier and establishing a cut-off condition in the absence of a signal; a capactive feedback network connected between the output of said second amplifier and the input control element of said first amplifier, the leading edge of a signal coupled through said feedback network back biasing said diode and reducing the gain of said first amplifier.

References Cited by the Examiner

UNITED STATES PATENTS

| | | | |
|---|---|---|---|
| 2,833,870 | 5/1958 | Wilhelmsen ---------- | 330—21 |
| 2,959,716 | 11/1960 | Gordon. | |
| 3,098,937 | 7/1963 | Martens. | |

SAMUEL BERNSTEIN, *Primary Examiner.*

MAX L. LEVY, *Examiner.*